United States Patent [19]
Mehrad et al.

[11] Patent Number: 6,071,779
[45] Date of Patent: Jun. 6, 2000

[54] SOURCE LINE FABRICATION PROCESS FOR FLASH MEMORY

[75] Inventors: Freidoon Mehrad, Plano; Sarma S. Gunturi, Richardson; Cetin Kaya, Dallas; Kyle A. Picone, Austin, all of Tex.

[73] Assignee: Texas Instruments Incorporated, Dallas, Tex.

[21] Appl. No.: 09/225,436

[22] Filed: Jan. 5, 1999

Related U.S. Application Data

[60] Provisional application No. 60/071,471, Jan. 13, 1998.

[51] Int. Cl.⁷ .............................................. H01L 21/8247
[52] U.S. Cl. ........................... 438/262; 438/297; 438/529
[58] Field of Search ................................... 438/257, 262, 438/263, 296, 297, 529, 545

[56] References Cited

U.S. PATENT DOCUMENTS

| | | | |
|---|---|---|---|
| 5,210,047 | 5/1993 | Woo et al. | 438/263 |
| 5,418,741 | 5/1995 | Gill | 438/262 |
| 5,506,160 | 4/1996 | Chang | 438/262 |
| 5,763,309 | 6/1998 | Chang | 438/297 |

*Primary Examiner*—Chandra Chaudhari
*Attorney, Agent, or Firm*—Jacqueline J. Garner; W. James Brady, III; Frederick J. Telecky, Jr.

[57] ABSTRACT

A method of fabricating a semiconductor device having a memory array (9) that includes a source line (24) is provided. The method of forming the source line (24) may include providing a semiconductor substrate (52) having a source region (60) separated from a drain region (62) by a channel region (64). An isolation structure (70) may be formed in the semiconductor substrate (52). The isolation structure (70) may cross the source region (60), the drain region (62), and the channel region (64) of the semiconductor substrate (52). An isolation dielectric material (78) may be formed within the isolation structure (70). A continuous stack structure (50) may be formed outwardly from the channel region (64) of the semiconductor substrate (52) and the isolation structure (70). A first photomask (100) may be formed outwardly from the continuous stack structure (50) and the semiconductor substrate (52). The first photomask (100) may expose a strip region (102) of the semiconductor substrate (52) and the isolation structure (70). The isolation dielectric material (78) may be removed from the exposed portion the isolation structure (70) to expose the semiconductor substrate (52). A dopant may be implanted into the exposed semiconductor substrate (52) to form the source line (24) in the semiconductor device.

10 Claims, 6 Drawing Sheets

SOURCE LINE FABRICATION PROCESS FOR FLASH MEMORY

This application claims priority under 35 USC § 119 (e) (1) of provisional application No. 60/071,471 filed Jan. 13, 1998.

TECHNICAL FIELD OF THE INVENTION

This invention relates generally to the field of electronic devices and more particularly to an improved source line fabrication process for flash memory.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductive, semiconductive, and insulative regions formed on the semiconductor substrate.

FLASH memory, also known as FLASH EPROM or FLASH EEPROM, is a semiconductor component that is formed from an array of memory cells. Data can be written to each cell is within the array, but the data is erased in blocks of cells. Each cell includes a floating gate transistor having a source, drain, floating gate, and a control gate. The floating gate transistor uses channel hot electrons for writing from the drain and uses Fowler-Nordheim tunneling for erasure from the source. The source of each floating gate transistor in the cells of a row in the array are connected to form a source line.

The cells are electrically isolated from one another by an isolation structure. One type of isolation structure used is a LOCal Oxidation of Silicon (LOCOS) structure. LOCOS structures are generally formed by thermally growing a localized oxidation layer between the cells to electrically isolate the cells. Another type of isolation structure used is a Shallow Trench Isolation (STI). STI structures are generally formed by etching a trench between the cells and filling the trench with a suitable dielectric material.

Some source line fabrication process utilize a patterned photomask that exposes a source region of the semiconductor substrate as well as a portion of the floating gate transistors in the array. The exposed areas are subsequently anisotropically etched and then subjected to an ion implantation process that forms the source line and the self-aligned source for each floating gate transistor. Although the etching process is non-selective to the materials comprising the semiconductor substrate and the floating gate transistor, the etching process removes a portion of the exposed semiconductor substrate and the floating gate transistor.

The removed portion of the semiconductor substrate forms a notch immediately adjacent the floating gate transistor. The notch adversely affects the floating gate transistor by increasing the stress on the floating gate transistor. The increased stress can result in a source-to-drain short of the floating gate transistor. The notch also lowers the dopant concentration in the source adjacent the floating gate transistor. The low dopant concentration can result in erase errors during operation of the memory array.

SUMMARY OF THE INVENTION

Accordingly, a need has arisen for an improved source line fabrication process for flash memory. The present invention provides an improved source line fabrication process for flash memory that substantially eliminates or reduces problems associated with the prior methods and systems.

In accordance with one embodiment of the present invention an improved source line fabrication process for a memory array in a semiconductor device includes providing a semiconductor substrate having a source region separated from a drain region by a channel region. An isolation structure which crosses the source, drain, and channel regions of the semiconductor substrate is formed in the semiconductor substrate. The isolation structure includes an isolation dielectric material within the isolation structure. A continuous stack structure is formed outwardly from the channel region of the semiconductor substrate and the isolation structure. A first photomask is formed outwardly from the continuous stack structure and the semiconductor substrate wherein the first photomask exposes a strip region of the semiconductor substrate and the isolation structure. The isolation dielectric material is then removed from the exposed portion the isolation structure to expose the semiconductor substrate. A dopant is then implanted into the exposed semiconductor substrate to form the source line in the memory array.

Important technical advantages of the present invention include fabricating a source line that does not include a notch that is immediately adjacent to the continuous stack structure. This reduces the stress on the floating gate transistor and can reduce the likelihood of a source-to-drain short in the transistor. Accordingly, the fewer transistors within the memory array that are non-functional.

Another technical advantage of the present invention is that there is a greater uniformity and concentration of dopant within the source adjacent the floating gate transistor. The increased dopant may reduce erase errors during operation of the floating gate transistor and the memory array.

Yet another technical advantage of the present invention is that the floating gate is not etched during the etching process to remove a portion of the isolation structure.

Other technical advantages will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 7 illustrate various aspects of an electronic device and the fabrication of a source line used within the electronic device. As described in greater detail below, two individual processes for fabricating a source line are disclosed. Each of these processes includes the use of additional photoresist masks to reduce or eliminate similar problems in the fabrication of a source line in a memory array.

Figure 1:
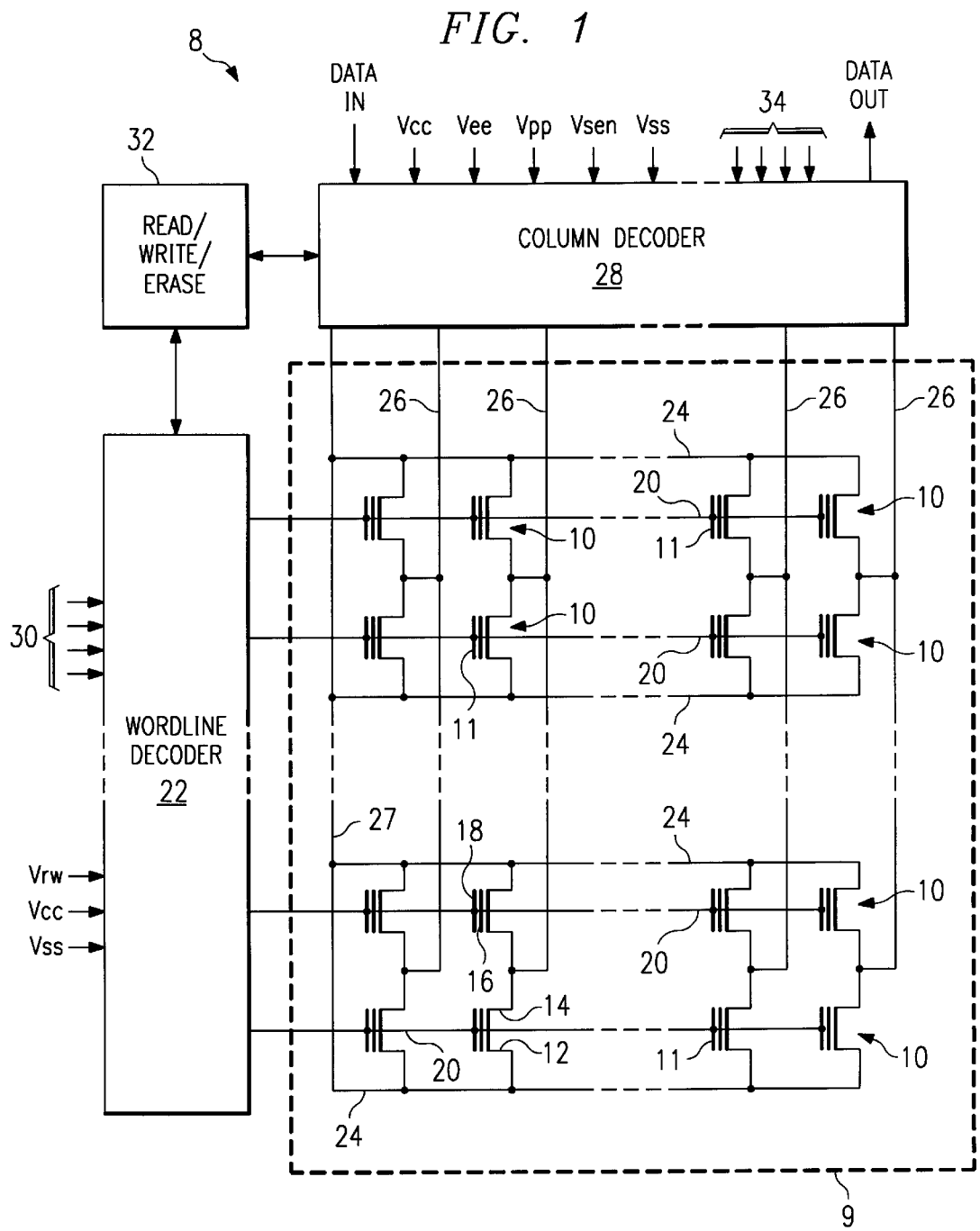
FIG. 1 is an electrical schematic diagram, in partial block diagram form, of an electronic device which includes a memory array in accordance with the present invention.

FIG. 1 is an electrical schematic diagram, in partial block form, of an electronic device 8 in accordance with one embodiment of the present invention. The electronic device 8 includes a wordline decoder 22, a column decoder 28, a Read/Write/Erase control circuit 32 for controlling the decoders 22 and 28, and a memory array 9. The memory array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28 and each of the drain-column lines 26 is coupled to the column decoder 28.

In a write or program mode, the wordline decoder 22 may function, in response to wordline address signals on lines 30 and to signals from the Read/Write/Erase control circuit 32 to place a preselected first programming voltage $V_{RW}$, approximately +12 V, on a selected wordline 20, which us coupled to the control gate 18 of a selected cell 10. Column decoder 28 also functions to place a second programming voltage $V_{PP}$, approximately +5 to +10 V, on a selected drain-column line 26 and, therefore, the drain 14 of the selected cell 10. Source lines 24 are coupled to a reference potential $V_{SS}$ through line 27. All of the deselected drain-column lines 26 are coupled to the reference potential $V_{SS}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately −2 V to −6 V with respect to the gate region. For memory cells 10 fabricated in accordance with one embodiment of the present invention, the coupling coefficient between the control gate 18, the wordline 20, and the floating gate 16 is approximately 0.5. Therefore, a programming voltage $V_{RW}$ of 12 volts, for example, on a selected wordline 20, which includes the selected gate control 18, places a voltage of approximately +5 to +6 V on the selected floating gate 16. The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read as "one" bits.

In a flash erase mode, the column decoder 28 functions to leave all drain-column lines 26 floating. The wordline decoder 22 functions to connect all of the word lines 20 to the reference potential $V_{SS}$, The column decoder 28 also functions to apply a high positive voltage $V_{EE}$, approximately +10 V to +15 V, to all of the source lines 24. These erasing voltages create sufficient field strength across the tunneling area between floating gate 16 and the semiconductor substrate to generate a Fowler-Nordheim tunnel current that transfers charge from the floating gate 16, erasing the memory cell 10.

In the read mode, the wordline decoder 22 functions, in response to wordline address signals on lines 30 and to signals from Read/Write/Erase control circuit 32, to apply a preselected positive voltage $V_{CC}$, approximately +5 V, to the selected wordline 20, and to apply a low voltage, ground or $V_{SS}$, to deselected wordlines 20. The column decoder 28 functions to apply a preselected positive voltage $V_{SEN}$, approximately +1.0 V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
| --- | --- | --- | --- |
| Selected Wordline | 5 V | 12 V | 0 V (All) |
| Deselected Word lines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

Figure 2:
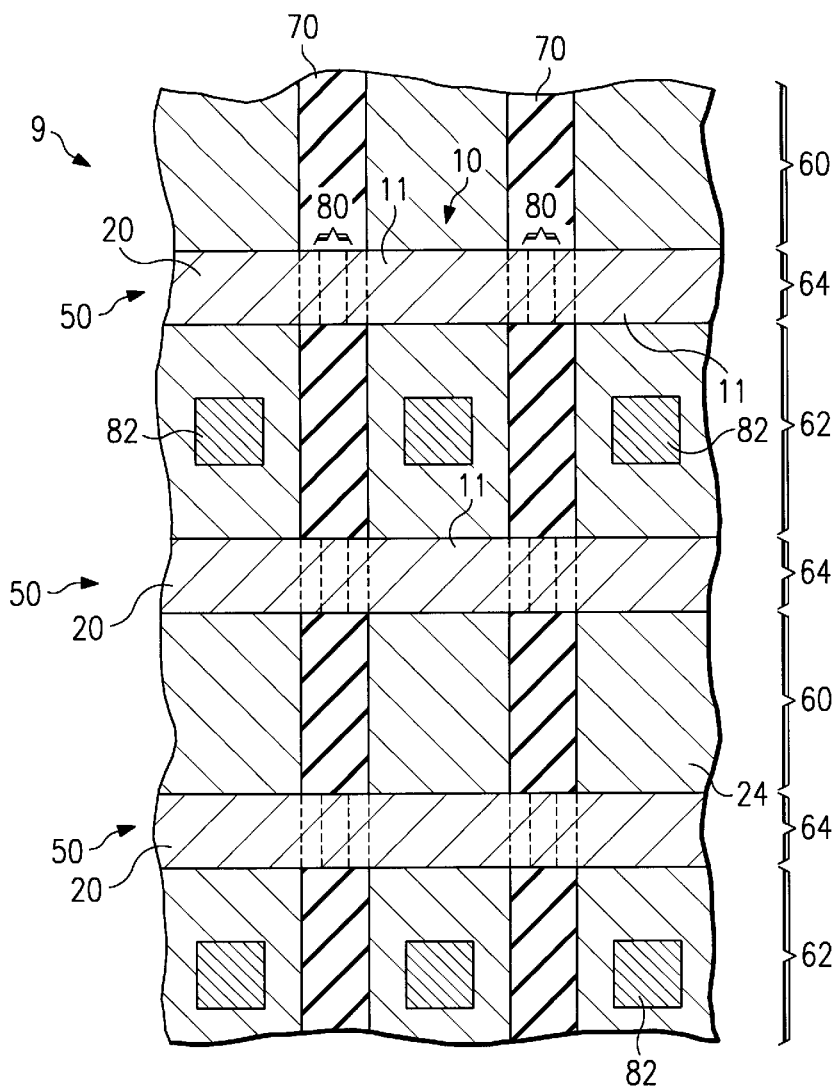
FIG. 2 is an enlarged plan view of a portion of the memory array of FIG. 1 in accordance with the present invention.
Figure 3:
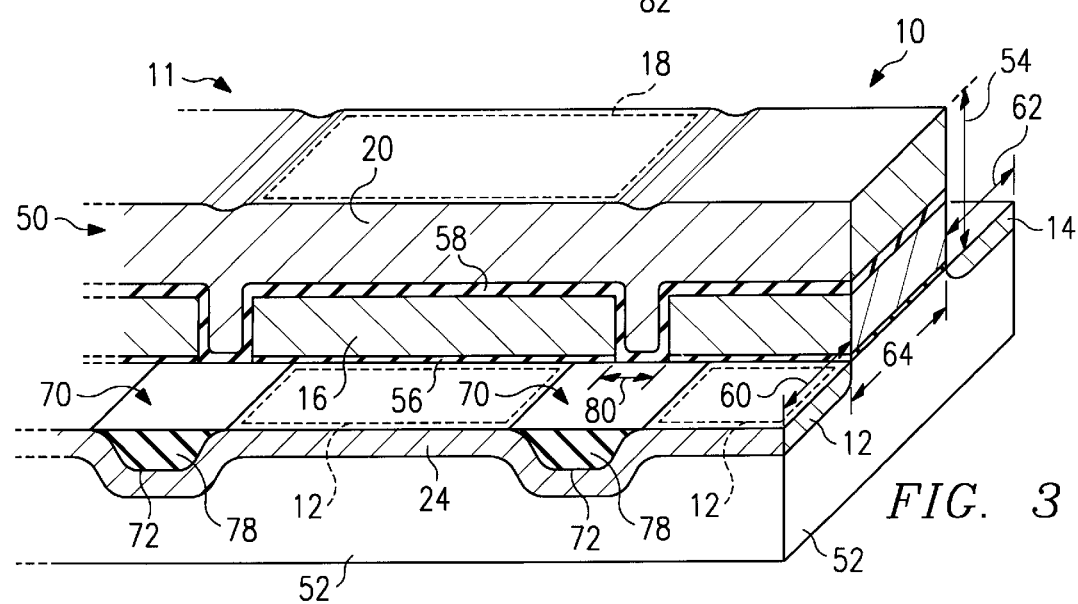
FIG. 3 is a perspective view of a portion of the memory array of FIG. 2 in accordance with the present invention.

FIGS. 2 and 3 illustrate the structure of a portion of the memory array 9 illustrated in FIG. 1. Specifically, FIG. 2 is an enlarged plan view of a portion of a memory array 9, and FIG. 3 is a perspective view of a portion of the memory array 9 illustrated in FIG. 2. As discussed previously, the memory array 9 includes a number of memory cells 10 arranged in rows and columns.

As best illustrated in FIG. 3, each row of memory cells 10 is formed from a continuous stack structure 50 that includes a number of memory cells 10. The floating gate transistor 11 within each memory cell 10 is formed on a semiconductor substrate 52 and separated from each adjacent memory cell 10 in the continuous stack structure 50 by an isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. However, it will be understood that the semiconductor substrate 52 may comprise other suitable materials or layers without departing from the scope of the present invention. For example, the semiconductor substrate 52 may include an epitaxial layer, a recrystallized semiconductor material, a polycrystalline semiconductor material, or any other suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 3, the floating gate transistors 11 in each continuous stack structure 50 in the memory array 9 are electrically isolated from one another by the isolation structure 70. The isolation structures 70 are generally formed prior to the fabrication of the gate stack 54 on the semiconductor substrate 52. The isolation structures 70 are LOCal Oxidation of Silicon (LOCOS) structures or shallow trench isolation (STI) structures. A LOCOS structure is illustrated in FIG. 3. As described in greater detail below, the isolation structure 70 includes a trench 72 that is filled with a isolation dielectric material 78.

LOCOS structures are generally formed by thermally growing a localized oxidation layer between the cells 10 to electrically isolate the cells 10. The LOCOS structure is generally grown to a thickness on the order of 600 to 1,000 nanometers, using a steam growth process or a High Pressures Oxidation (HIPOX) process. The LOCOS structure forms a trench 72 having a dish shape as illustrated in FIG. 3. The growth process to form a LOCOS structure generally forms silicon dioxide within the trench 72. One problem associated with LOCOS structures is that they include non-functional areas, such as a birds beak, that waste valuable space on the semiconductor substrate 52.

STI structures are generally formed by etching the trench 72 into the semiconductor substrate 52. The trench 72 is generally on the order of 0.3 to 8.5 $\mu$m in depth. The trench 72 is then filled with isolation dielectric material 78 to electrically isolate the active regions of the semiconductor substrate 52 between the isolation structures 70. The isolation dielectric material 78 may comprise silicon dioxide, silicon nitride, or a combination thereof.

The isolation dielectric material 78 forming the isolation structure 70, whether a LOCOS structure or a STI structure, is generally etched back, followed by a deglaze process to clean the surface of the semiconductor substrate 52 prior to fabrication of the gate stack 54. It will be understood that the isolation dielectric material 78 may comprise other suitable dielectric materials without departing from the scope of the present invention.

The continuous stack structure 50 is then fabricated outwardly from the semiconductor substrate 52 and the filled trench 72. The continuous stack structure 50 is formed from a series of gate stacks 54 fabricated outwardly from the channel region 64 of the semiconductor substrate 52. As best shown in FIG. 3, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator 56. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise oxide or nitride on the order of 100 to 500 Å in thickness. It will be understood that the gate insulator 56 may comprise other materials suitable for insulating semiconductor elements.

The floating gate 16 and the control gate 18 are conductive regions. The gates 16 and 18 generally comprise a polycrystalline silicon material (polysilicon) that is in-situ doped with impurities to render the polysilicon conductive. The thicknesses of the gates 16 and 18 are generally on the order of 100 nanometers and 300 nanometers, respectively. It will be understood that the gates 16 and 18 may comprise other suitable conductive materials without departing from the scope of the present invention.

The interstitial dielectric 58 may comprise oxide, nitride, or a heterostructure formed by alternating layers of oxide and nitride. The interstitial dielectric 58 is on the order of 20 to 40 nanometers in thickness. It will be understood that the interstitial dielectric 58 may comprise other materials suitable for insulating semiconductor elements.

As best illustrated in FIG. 2, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9.

In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. In one embodiment, the floating gates 16 in adjacent memory cells 10 are isolated by a gap 80. The gap 80 is generally etched into a layer of conductive material (not shown) that is used to form the floating gate 16.

The source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26 (not shown). The drain column line 26 is generally formed outwardly from the wordline 20. As will be discussed in greater detail below, the source 12 of each floating gate transistor 11 forms a portion of the source line 24 and is formed during the fabrication of the source line 24.

As best illustrated in FIG. 3, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 3, the source line 24 crosses the isolation structures 70 in the source region 60 of the semiconductor substrate 52 below the isolation structures 70. In contrast, the isolation structures 70 electrically isolate the adjacent floating gate transistors 11 in the channel region 64 of the semiconductor substrate.

The source lines 24, and correspondingly the sources 12 of each floating gate transistor 11, are fabricated after at least a portion of the gate stack 54 has been fabricated. As will be discussed in greater detail below, the gate stack 54, the drain region 62, and a portion of the source region 60 is pattern masked using conventional photolithography techniques such that a portion of the isolation structure 70 in the source region 60 exposed. The exposed portion of the isolation structure 70 is removed to expose the semiconductor substrate 52. The exposed semiconductor substrate 52 is doped with impurities to render the region conductive and form the source line 24. Alternative methods of pattern masking used in the formation of the source line 24 are detailed below.

Figure 4A:
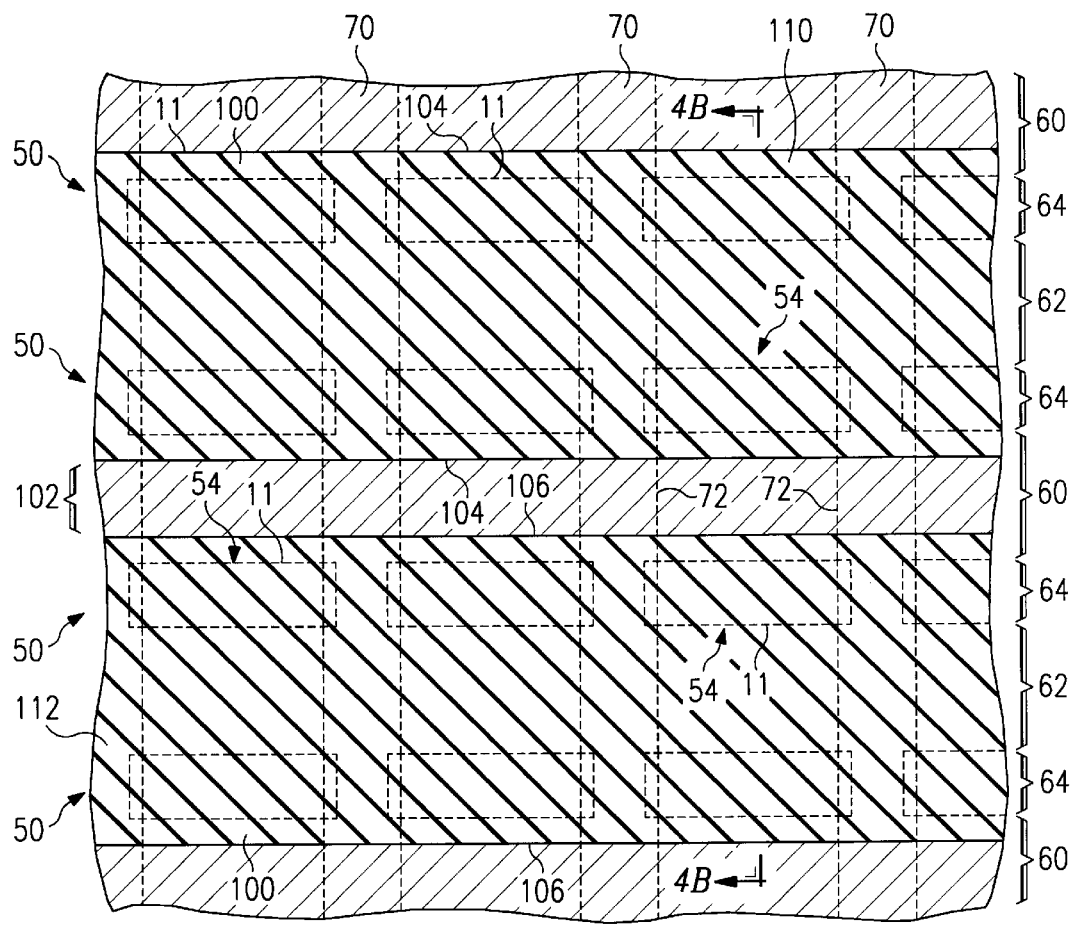
FIG. 4A is a plan view of a portion of a memory array during fabrication of a source line according to one embodiment of the present invention.
Figure 4B:
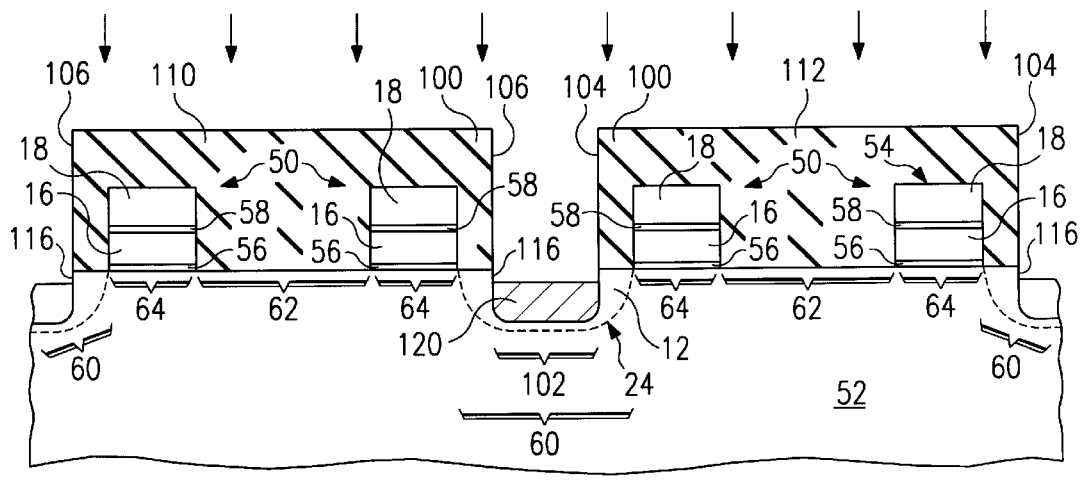
FIG. 4B is a schematic cross sectional view of the memory array of FIG. 4A taken along line 4B of FIG. 4A.

FIGS. 4 and 5 illustrate a pattern masking process for forming the source line 24 according to one embodiment of the present invention. Specifically, FIG. 4A is a plan view of a portion of the memory array 9 during fabrication of the source line 24. FIG. 4B is a schematic cross sectional view of the memory array 9 of FIG. 4A taken along line 4B of FIG. 4A.

Referring to FIGS. 4A and 4B, the semiconductor substrate 52 is shown with the continuous stack structures 50 crossing the isolation structures 70. As discussed earlier, the continuous stack structures 50 include a number of gate stacks 54 that are formed outward from the channel region 64 of the semiconductor substrate 52. The channel region 64 separates the source region 60 from the drain region 62 of the semiconductor substrate 52.

A first photomask 100 is formed outwardly from the continuous stack structure 50, the drain region 62, and a portion of the source region 60 such that a strip region 102 of the semiconductor substrate 52 and the isolation structure 70 is exposed. The first photomask 100 includes a first side 104 and a second side 106 that define the stip region 102. The first photomask 100 is fabricated by conventional photolithography techniques. One such photolithography technique for fabricating the first photomask 100 includes applying a layer of photoresist material (not shown) outwardly from the semiconductor substrate 52 and the continuous stack structures 50. The photoresist material comprises a material that cures in response to electromagnetic radiation, such as light. Electromagnetic radiation is focused through a mask pattern (not shown) onto the layer of photoresist material. The mask pattern blocks a portion of the electromagnetic radiation such that the electromagnetic radiation striking the layer of photoresist material is in a pattern. The photoresist material cures in a pattern corresponding to the pattern of electromagnetic energy striking the layer of photoresist material. The non-cured portions of the photoresist material are then removed to form the first photomask 100. It will be understood that the first photomask 100 may comprise any suitable photoresist material without departing from the scope of the present invention. For example, the first photomask 100 may comprise Deep UltraViolet (DUV) or other suitable material.

In one embodiment, the first photomask 100 is fabricated from a first mask 110 and a second mask 112. In this embodiment, the first photomask 100 is formed in two separate pattern masking process steps. The first mask 110 is formed such that the first mask 110 defines the first side 104 of the first photomask 100. The second mask 112 is then formed such that the second mask 112 defines the second side 106 of the first photomask 100. The separate pattern masking process steps allow the masks 110 and 112 to be fabricated such that the strip region defined by the masks 110 and 112 is narrower than the strip region that can be fabricated using a single mask. This is important when the width of the strip region 102 is of such small size that it is less than the linewidth resolution of the pattern masking process. In other words, the pattern masking process cannot fabricate a single mask that exposes the strip region 102.

Referring to FIG. 4B, the exposed portions of the isolation structure 70 and the semiconductor substrate 52 are then etched to remove the isolation dielectric material 78 and expose the semiconductor substrate 52. The etching process to remove the isolation dielectric material 78 may be an anisotropic etching process. Anisotropic etching may be performed using a reactive ion etch (RIE) process using carbon-fluorine based gases such as $CF_4$ or $CHF_3$. The etching process is selective to the isolation dielectric material 78 (FIG. 3) and is non-selective to the material comprising the semiconductor substrate 52. In other words, the etching process substantially removes the isolation dielectric material 78 without substantially removing the material comprising the semiconductor substrate 52.

Although the etching process is non-selective to the semiconductor substrate 52, a portion of the semiconductor substrate 52 is etched and forms a notch 116. As illustrated in FIG. 4B, the notch 116 is displaced from a region of the semiconductor substrate 52 immediately adjacent to the continuous stack structure 50. The high stresses associated with conventional notches formed immediately adjacent to a gate stack have been determined to be a factor in the failure of a floating gate transistor. The stresses on the gate stack associated with the displaced notch are lower than those associated with conventional notches. Therefore, the failure rate of floating gate transistors in operation with the displaced notches is lower than the failure rate of floating gate transistors in operation with conventional notches. In addition, as will be discussed in greater detail below, the displaced notch 116 increases the uniformity of the source 12, thereby increasing the operating performance of the floating gate transistor 11.

The exposed portion of the semiconductor substrate 52, including that portion of the semiconductor substrate 52 forming the trench 72, is doped with impurities to form a first conductive region 120. The first conductive region 120 is doped by an implantation process in which dopant ions are impinged into the semiconductor substrate 52. The first photomask 100 inhibits the dopant ions from impinging the masked portions of both the semiconductor substrate 52 and the continuous stack structure 50.

Figure 5A:
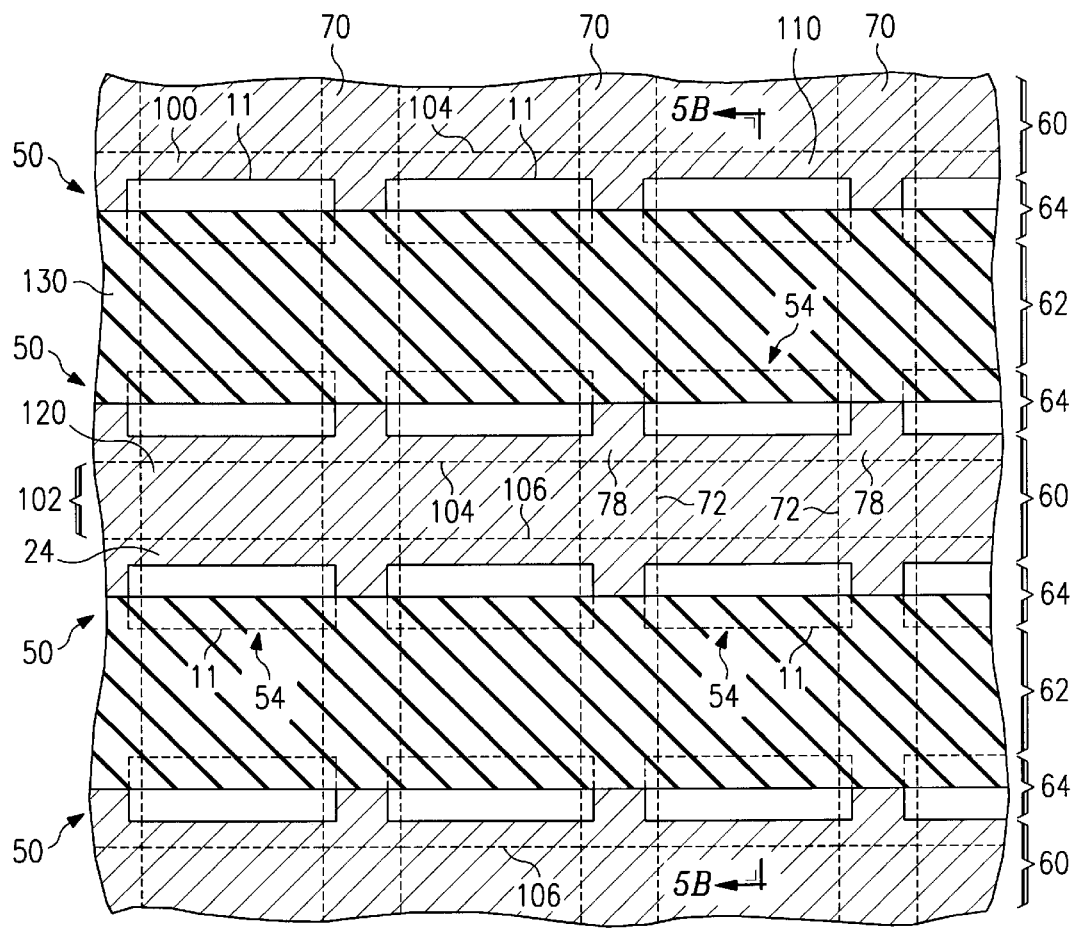
FIG. 5A is a plan view corresponding to FIG. 4A illustrating an optional processing step during fabrication of the source line in accordance with the present invention.
Figure 5B:
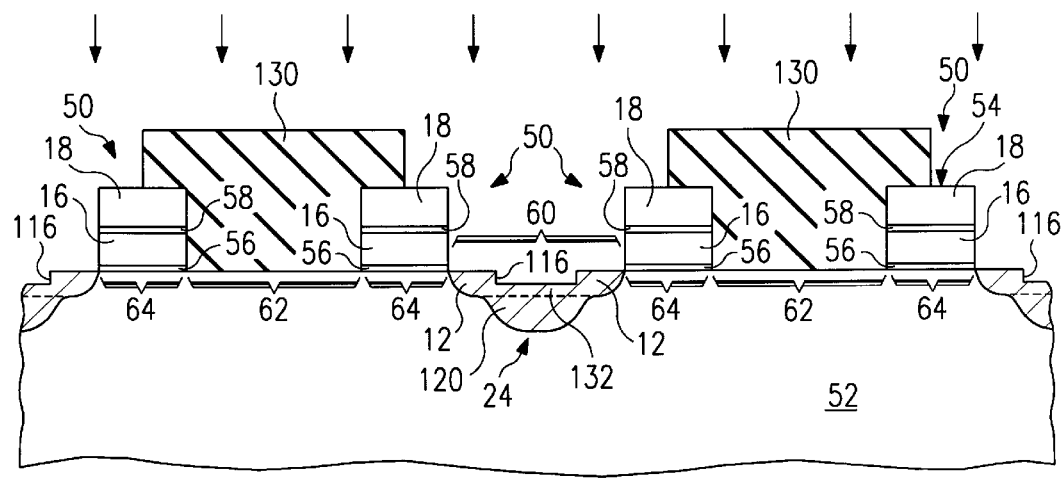
FIG. 5B is a schematic cross sectional view of the memory array of FIG. 5A taken along line 5B of FIG. 5A.

FIGS. 5A and 5B illustrate different views of a subsequent pattern masking processing step for fabricating the source line 24. Specifically, FIG. 5A is a plan view corresponding to FIG. 4A. FIG. 5B is a schematic cross sectional view of the memory array of FIG. 5A taken along line 5B of FIG. 5A.

Referring to FIG. 5A, the first photomask 100 is removed after the fabrication of the first conductive region 120. A second photomask 130 is then formed outwardly from the drain region 62 and a portion of the adjacent continuous stack structures 50, such that the source region 60 of the semiconductor substrate 52 and a portion of the continuous stack structures 50 are exposed. The second photomask 130 is formed by conventional photolithography techniques as described previously. The second photomask 130 is generally not fabricated using multiple masking steps.

Referring to FIG. 5B, the exposed portion of the semiconductor substrate 52 and the continuous stack structure 50 are doped with impurities by an ion implantation process. Although portions of the continuous stack structures 50 are implanted with dopant ions, the dopant does not affect the operation of the floating gate transistors 11 within the continuous stack structures 50. In particular, the energy with which the dopant ions are implanted into the floating gates 16 is insufficient to detrimentally affect the operation of the floating gate transistor 11.

The dopant ions implanted into the exposed semiconductor substrate 52, i.e. the source region 60, to form a second conductive region 132. The first conductive region 120 and the second conductive region 132 are then thermally treated to diffuse the dopant ions into the semiconductor substrate 52 to form both the source 12 of each floating gate transistor 11 as well as the source line 24. In this embodiment, the second conductive region 132 forms the self-aligned source 12 for each floating gate transistor 11. By using the second photomask 130, the spacing the of the masks 110 and 112 relative to the continuous stack structures 50 is relatively unimportant in the self-aligned source fabrication process.

Figure 6A:
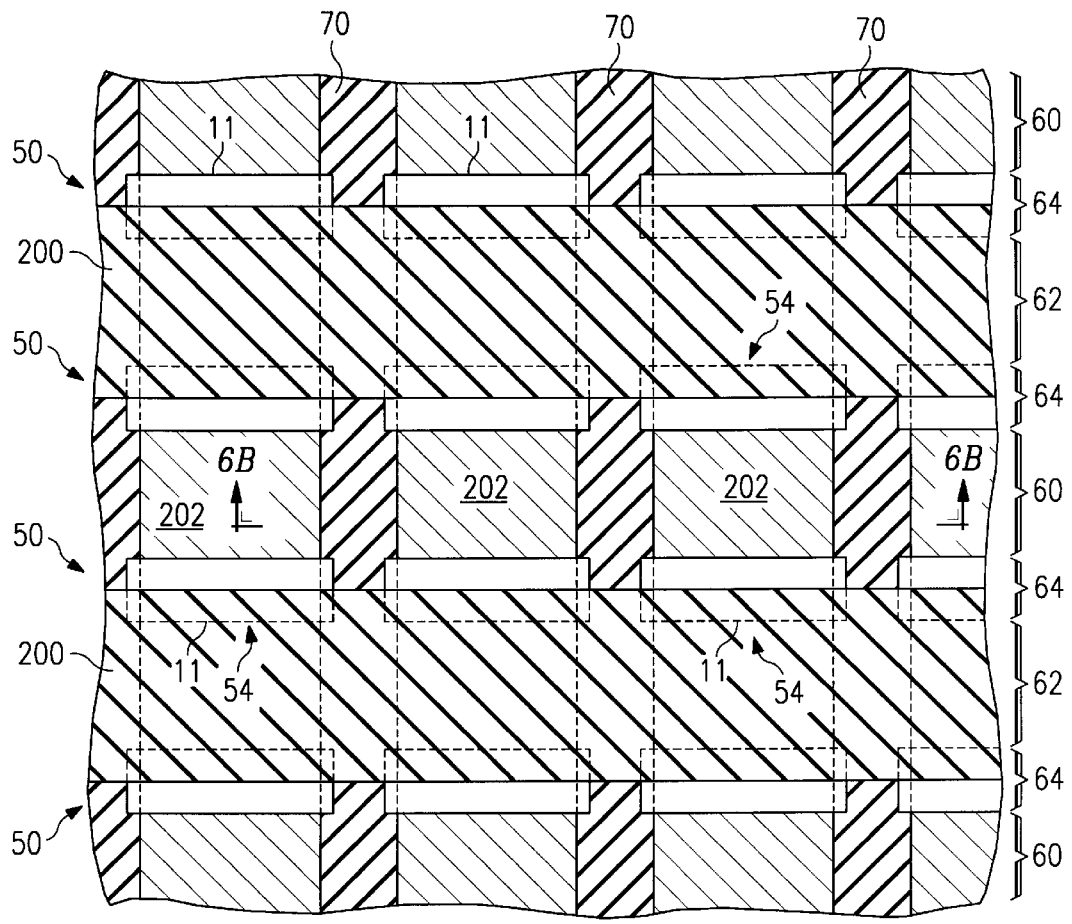
FIG. 6A is a plan view of a portion of a memory array during fabrication of a source line in accordance with the present invention.
Figure 6B:
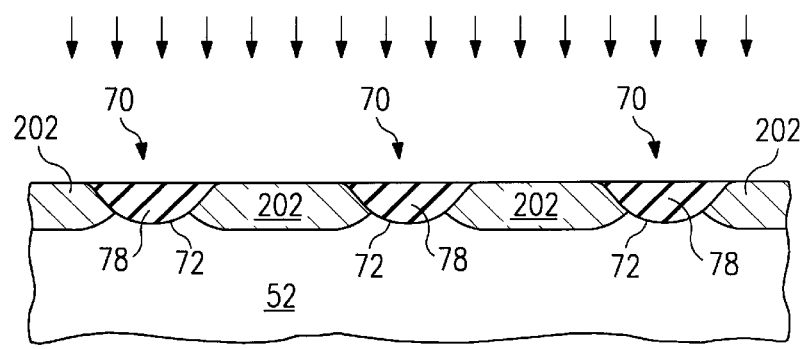
FIG. 6B is a schematic cross sectional view of the memory array of FIG. 6A taken along line 6B of FIG. 6A.

FIGS. 6 and 7 illustrate a pattern masking process for forming the source line 24 according to another embodiment of the present invention. Specifically, FIG. 6A is a plan view of a portion of the memory array 9 during fabrication of the source line 24. FIG. 6B is a schematic cross sectional view of the memory array 9 of FIG. 6A taken along line 6B of FIG. 6A.

Referring to FIGS. 6A and 6B, the semiconductor substrate 52 is shown with the continuous stack structures 50 crossing the isolation structures 70. As previously described, the continuous stack structures 50 include a number of gate stacks 54 that are formed outward from the channel region 64 of the semiconductor substrate 52. The channel region 64 separates the source region 60 from the drain region 62 of the semiconductor substrate 52.

As best illustrated in FIG. 6A, a first photomask 200 is formed outwardly from the drain regions 62 and a portion of the adjacent continuous stack structures 50, such that the source region 60 of the semiconductor substrate 52 and a portion of the continuous stack structures 50 are exposed. The first photomask 200 is formed by conventional photolithography techniques as previously described. The first photomask 200 is generally not fabricated using multiple masking steps.

The exposed portion of the semiconductor substrate 52 and the continuous stack structure 50 are doped with impurities by an ion implantion process. Although portions of the continuous stack structures 50 are implanted with dopant, the dopant does not affect the operation of the floating gate transistors 11 within the continuous stack structures 50. In particular, the energy with which the dopant ions are implanted into the floating gates 16 are insufficient to detrimentally affect the operation of the floating gate transistor 11.

As best illustrated in FIG. 6B, the dopant implanted into the exposed semiconductor substrate 52, i.e. the source region 60, forms a number of first conductive regions 202. The first conductive regions 202 are non-continuous as the dopant is not implanted through the isolation structures 70.

The first photomask 200 may then be removed by conventional photoresist removal techniques.

Figure 7A:
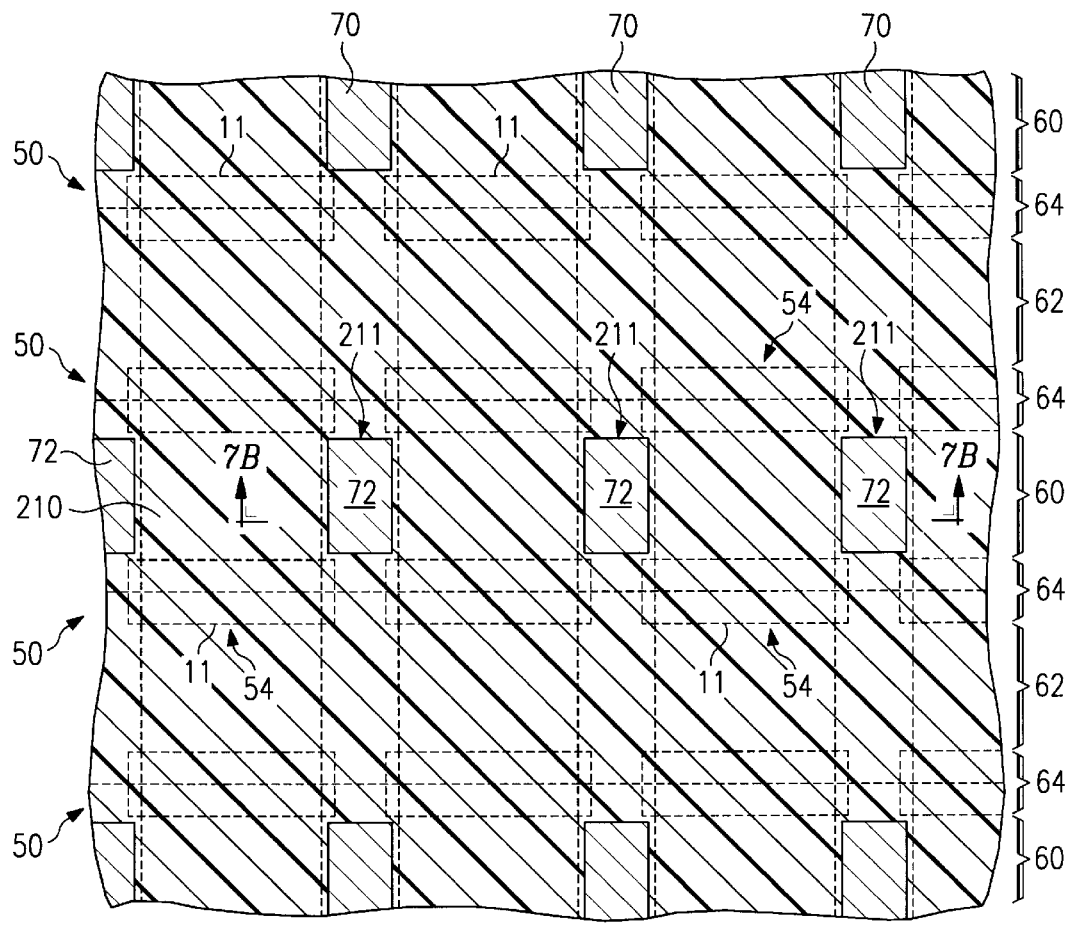
FIG. 7A is a plan view corresponding to FIG. 6A illustrating the fabrication of the source line in accordance with the present invention.
Figure 7B:
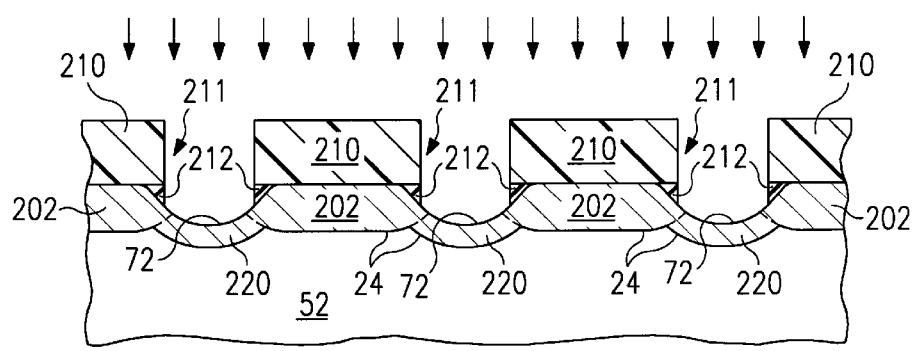
FIG. 7B is a schematic cross sectional view of FIG. 7A taken along line 7B of FIG. 7A.

FIGS. 7A and 7B illustrate different views of a subsequent pattern masking processing step for fabricating the source line 24. Specifically, FIG. 7A is a plan view corresponding to FIG. 6A, and FIG. 7B is a schematic cross sectional view taken along line 7B of FIG. 7A.

As best illustrated in FIG. 7A, a second photomask 210 is formed outwardly from the semiconductor substrate 52 and the continuous stack structures such that the second photomask 210 defines an open window 211 that exposes a portion of the isolation structure 70 within the source region 60. As best illustrated in FIG. 7B, the photomask 210 defines a number of open windows 211 that correspond to each isolation structure 70. Each of the open windows 211 expose substantially all of the corresponding isolation structure 70 that is within the source region 60 of the semiconductor substrate 52.

As best illustrated in FIG. 7B, the exposed isolation structure 70 is then etched to remove the isolation dielectric material 78 and expose the underlying semiconductor substrate 52. The etching process to remove the isolation dielectric material 78 may be an anisotropic etching process. Anisotropic etching may be performed using a reactive ion etch (RIE) process using carbon-fluorine based gases such as CF4 or CHF3.

The fabrication of the open window 211 is robust due to the amount of misalignment and sizing errors that may be tolerated during fabrication of the second photomask 210. Any misalignment or sizing errors in the location and size of the open window 211 may be apparent after the etching process by the formation of ear-like structures 212 within the trench 72. The ear-like structures 212 comprise that portion of the isolation dielectric material 78 after the anisotropic etching process. The ear-like structures 212 do not substantially affect the subsequent formation of the source line 24. Accordingly, the second photomask 210 does not require a high degree of precision during fabrication and can thus be fabricated less expensively.

The exposed semiconductor substrate 52 within the open window 211 is then doped with impurities to form a number of second conductive regions 220. The second conductive regions 220 are formed by an implantation process in which dopant ions are impinged within the semiconductor substrate 52 exposed within the open window 211. The second photomask 210 forms a barrier to prevent the ion implantation of other areas of the semiconductor substrate 52 and the continuous stack structures 50.

The first conductive region 202 in conjunction with the second conductive region 220 form a continuous conductive region. The conductive regions 202 and 220 may be thermally treated to diffuse the impurities into the semiconductor substrate 52 to form the continuous conductive region. The continuous conductive region forms both the source 12 of each floating gate transistor 11 as well as the source line 24.

The second photomask 210 may then be removed by conventional photoresist removal techniques.

In this embodiment, the source line 24 is fabricated without adverse etch damage to the semiconductor substrate 52. The lack of etch damage reduces the stresses on the continuous stack structure 50 and each individual floating gate transistor 11. Accordingly, source-to-drain shorts may be reduced and erase errors may be reduced or eliminated. In addition, this embodiment provides a method of fabricating the source line 24 that includes only one additional pattern mask. Accordingly, the overall cost of fabricating the semiconductor component is reduced.

The process of fabricating the second conductive region 220 using the second photomask 210 may be accomplished prior to the process of fabricating the first conductive region 202 using the first photomask 200. Thus, the order of fabricating the first and second conductive regions 200 and 210 does not affect the source line 24.

Although the present invention has been described with several embodiments, various changes and modifications may be suggested to one skilled in the art. It is intended that the present invention encompass such changes and modifications that follow within the scope of the appended claims.

What is claimed is:

1. A method of fabricating a source line in a semiconductor device, comprising the steps of:

providing a semiconductor substrate having a source region separated from a drain region by a channel region;

forming an isolation structure in the semiconductor substrate that crosses the source, drain, and channel regions of the semiconductor substrate, the isolation structure including an isolation dielectric material;

forming a continuous stack structure outwardly from the channel region of the semiconductor substrate and the isolation structure;

forming a first photomask outwardly from the continuous stack structure and the semiconductor substrate, the first photomask exposing a strip region of the semiconductor substrate and the isolation structure within the source region;

removing the isolation dielectric material from the exposed portion of the isolation structure to expose the semiconductor substrate; and implanting a dopant into the exposed semiconductor substrate to form a first conductive region;

removing the first photomask;

forming a second photomask outwardly from a portion of the continuous stack structure and the drain region such that the source region and a portion of the continuous stack structure is exposed;

implanting the dopant into the exposed semiconductor substrate to form a second conductive region; and thermally treating the semiconductor substrate to diffuse the dopant within the first and second conductive regions to form the source line in the semiconductor device.

2. The method of claim 1, wherein the step of forming a first photomask comprises the steps of:

forming a first mask outwardly from the semiconductor substrate and the continuous stack structure, the first mask defining a first side of a first photomask;

forming a second mask outwardly from the semiconductor substrate and the continuous stack structure, the second mask defining a second side of the first photomask;

wherein the first and second mask form the first photomask, and the first side and the second side of the first photomask define a stip region that exposes a portion source region of the semiconductor substrate.

3. The method of claim 1, wherein the isolation structure is a LOCOS isolation structure.

4. The method of claim 1, wherein the step of removing the isolation dielectric material comprises the step of anisotropically removing the isolation dielectric material from the exposed portion of the isolation structure to expose the semiconductor substrate.

5. The method of claim 1, wherein the isolation dielectric material is silicon dioxide.

6. The method of claim 1, wherein the first photomask comprises a first mask and a second mask fabricated separately.

7. A method of fabricating a source line in a semiconductor device, comprising the steps of:

providing a semiconductor substrate having a source region separated from a drain region by a channel region;

forming an isolation structure in the semiconductor substrate that crosses the source, drain, and channel regions of the semiconductor substrate, the isolation structure including an isolation dielectric material;

forming a continuous stack structure outwardly from the channel region of the semiconductor substrate and the isolation structure;

forming a first photomask outwardly from a portion of the continuous stack structure and the drain region such that the source region and a portion of the continuous stack structure are exposed;

implanting a dopant into the exposed semiconductor substrate to form a plurality of first conductive regions;

removing the first photomask;

forming a second photomask outwardly from the semiconductor substrate and the continuous stack structure such that an open window is defined that exposes a portion of the isolation structure within the source region;

removing the isolation dielectric material from the exposed portion of the isolation structure to expose the semiconductor substrate; and implanting the dopant into the exposed semiconductor substrate to form a second conductive region; and removing the second photomask;

thermally treating the semiconductor substrate to diffuse the dopant within the first and second conductive regions to form the source line in the semiconductor device.

8. The method of claim 7, wherein the isolation structure is a LOCOS isolation structure.

9. The method of claim 7, wherein the step of removing the isolation dielectric material comprises the step of anisotropically removing the isolation dielectric material from the exposed portion of the isolation structure to expose the semiconductor substrate.

10. The method of claim 7 wherein the steps of forming the second conductive region occurs before the steps of forming the plurality of first conductive regions.

* * * * *